United States Patent [19]

Chiulli

[11] Patent Number: 4,808,501
[45] Date of Patent: Feb. 28, 1989

[54] METHOD FOR MANUFACTURING AN OPTICAL FILTER

[75] Inventor: Carl A. Chiulli, Randolph, Mass.

[73] Assignee: Polaroid Corporation, Patent Dept., Cambridge, Mass.

[21] Appl. No.: 50,743

[22] Filed: May 15, 1987

Related U.S. Application Data

[63] Continuation-in-part-of Ser. No. 787,254, Oct. 15, 1985, abandoned.

[51] Int. Cl.$^4$ .............................................. G03F 9/00
[52] U.S. Cl. ......................................... 430/7; 430/145; 430/165; 430/191; 430/293; 430/321; 430/330; 430/394
[58] Field of Search .................. 430/7, 321, 293, 394, 430/326, 330, 4, 145, 165, 191; 350/339 F

[56] References Cited

U.S. PATENT DOCUMENTS

| | | | |
|---|---|---|---|
| 3,258,337 | 6/1966 | Cousins | 430/293 |
| 4,311,773 | 1/1982 | Kaneko et al. | 430/7 |
| 4,377,631 | 3/1983 | Toukhy et al. | 430/192 |
| 4,383,017 | 5/1983 | Hirofumi et al. | 430/7 |
| 4,388,387 | 6/1983 | Tsuboi | 430/7 |
| 4,650,745 | 3/1987 | Eilbeck | 430/326 |

FOREIGN PATENT DOCUMENTS

| | | |
|---|---|---|
| 2593611 | 7/1987 | France . |
| 58-100107 | 6/1983 | Japan . |
| 59-83113 | 5/1984 | Japan . |
| 99102 | 5/1986 | Japan . |
| 99103 | 5/1986 | Japan . |
| 504171 | 4/1976 | U.S.S.R. . |

OTHER PUBLICATIONS

Neureuther and Dill, in "Photoresist Modeling and Device Fabrication Applications", Proc. Microwave Research Symp. XVIII, New York, Apr. 1974.

Primary Examiner—José G. Dees
Attorney, Agent, or Firm—Louis G. Xiarhos

[57] ABSTRACT

A color filter is formed on a support, such as a charge coupled device, by (a) forming a layer on a support with a composition comprising a positive photoresist and a dye; said dye being soluble in the solvent of said photoresist; (b) exposing predetermined portions of said layer to radiation adapted to increase the solubility of said coating in the exposed areas; (c) developing said exposed areas to form a pattern of filter elements; and (d) repeating said steps with a different color dye in said composition; wherein said dye constitutes in excess of 10% by weight, dry basis of said composition, is substantially non-absorptive in the exposure wavelength of said composition, and provides predetermined absorptive characteristics for the specified filter element and said dye possessing substantially the same polarity as said composition.

21 Claims, No Drawings

METHOD FOR MANUFACTURING AN OPTICAL FILTER

CROSS-REFERENCE TO RELATED APPLICATIONS

This application is a continuation-in-part of application Ser. No. 787,254, filed Oct. 15, 1985 abandoned.

BACKGROUND OF THE INVENTION

This invention relates to a color optical filter element for optical usages, such as a charge coupled device or color liquid crystal display.

To obtain color image recording using solid state image devices such as charge coupled devices, optical filters in a multicolor stripe or mosaic form are employed. A plurality of filter elements are employed generally red, green and blue or cyan, yellow and magenta. However, in some instances, fewer or additional colors may be employed.

A number of processes are disclosed in the art for preparing such filters. One widely used method of forming such filters may be broadly described as consisting of the steps of coating a photoresist, exposing incremental portions of the photoresist by the use of a mask or other means; development of the exposed portions, applying a color or rendering the photoresist colorless and then removing either the exposed or unexposed portion of the photoresist. These steps are then repeated for each color desired.

Most of the procedures employed in forming such filters on charge coupled devices (CCD) pose a number of problems. To begin with, the process itself is generally complicated and difficult. In addition, to be a useful process, the steps must conform to the requirements of the clean room environment where CCDs are manufactured. Further, the process involved must not involve any conditions which would be detrimental to the CCD and, of course, problems such as polymer or dye stability and adhesion of the filter layers to the CCD must also be addressed.

U.S. Pat. No. 4,311,733, issued Jan. 19, 1982, is directed to a method for producing color filters, which method comprises the steps of coating on a substrate, for example, a solid-state imager, a mixture of the light-absorbing material such as a dye and a photosensitive material, for example, a polymer such as gelatin or polyvinyl alcohol with a cross-linking agent. Since the unexposed polymer is removed as a result of this process, the material is classified as negative working. One requirement for the dye is that it can be removed with an appropriate solvent and will not remain as part of the final filter element. The thus-coated layer is exposed through a predetermined pattern. The light-absorbing material serves to attenuate the exposure from secondary reflections from the substrate that causes line distortion. The unexposed areas of the photosensitive material is removed with an appropriate solvent and the light-absorbing material from the photosensitive material which remains on the substrate is also removed either simultaneously with the removal of the unexposed photosensitive material or in a separate step. The last step involves the dyeing of the remaining photosensitive material adhering to the substrate to the desired color.

U.S. Pat. No. 4,383,017, issued May 10, 1983, is directed to a method for manufacturing a stripe filter about 10 micrometers or wider for optical uses particularly in a television camera. The method comprises a repeated series of steps which include coating a support with a mixture of a dye, dissolution accelerator and a photosensitive polymeric material such as dichromated gelatin. The coating is exposed through a mask, thereby forming a series of insoluble stripes in the exposed areas. Thus, the polymeric material can be classified as a negative photoresist. The insoluble material is then removed and the steps repeated using a polymeric coating composition with a different color each time. More specifically, the coating composition includes a photosensitive hardener, which upon exposure, as by ultraviolet rays, accelerates the reaction among the molecules of the coating material performing a cross-linking effect.

It is known in the art to mix dyes with photoresists prior to coating the photoresist on a substrate in etching processes in the manufacture of microcircuitry units. The concentration of the dye additive provides an antihalation effect or reduction of the standing wave effect. Reflected light from the substrate serves to distort the final patterned image, decreasing resolution. The dye employed must absorb in the wavelength of the exposing wavelength in order to function. After the etching step is carried out, the photoresist is removed. Thus, it will be seen that the dye in the photoresist performs a function only during exposure of the photoresist to provide anti-reflection effect by employing a uniformly dyed layer with a single color at a low dye density and which layer is removed prior to use of the element on which it is coated. A description of this may be found, for example, in U.S. Pat. No. 4,377,631, issued Mar. 22, 1983, and Neureuther and Dill, "*PHOTORESIST MODELING AND DEVICE FABRICATION APPLICATIONS*", PROC. MICROWAVE RESEARCH SYMP. XVIII, NEW YORK, APRIL 1974.

Japanese Patent Application No. 58/100107, application date Dec. 10, 1981, published June 14, 1983, is directed to a method for forming a filter employing a dye dispersion in a silver halide emulsion. A layer of dye dispersion, e.g., dye developer particles in a very fine grain silver halide emulsion is formed on a support. The emulsion is exposed to light through a mask. Where the light strikes the emulsion, developable silver is formed. Upon contact with a tanning developer, cross-linking of the gelatin occurs in the generation areas of exposure by the action of the silver and the oxidized developer. The unexposed, and therefore un-cross-linked, emulsion is removed by washing. The cross-linked areas are then subjected to bleaching and fixing which removes the silver, leaving only the dye-dispersion in the cross-linked gelatin. In spite of the "positive-type" terminology employed, the patent is employing a system which is essentially a "negative photoresist" since cross-linking occurs in the areas of *exposure* and the unexposed areas are washed away.

In employing dyes in positive photoresists, the prior art has been concerned with the effect of the dye on the entire system since the addition of the dye constitutes "foreign" matter in the photoresist composition which could effect the functioning of the photoresist. More specifically, such foreign matter could interfere with the dissolution of the photoactive compound. To avoid any adverse effects, the levels of the absorbing dyes employed were kept low. Still further, many dyes would be incompatible with the photoresist composition, forming a separate phase.

SUMMARY OF THE INVENTION

The present invention is directed to a method for preparing a color filter element for optical usage and more particularly for use with a charge coupled device. The method comprises the steps of (a) forming a layer on a support with a composition comprising a positive photoresist and a dye; said dye being soluble in the solvent of the photoresist; (b) exposing predetermined portions of said layer to radiation adapted to increase solubility of said layer in the exposed areas; (c) removing said exposed areas by a contact with a developer for said photoresist; and (d) repeating said steps with a different color dye in said composition wherein said dye constitutes in excess of 10% of said composition, dry weight basis; said dye being substantially non-absorptive in the exposure wavelength of said composition and which provides predetermined absorptive characteristics for the specified filter element and said dye processing substantially the same polarity as said composition.

DETAILED DESCRIPTION OF THE INVENTION

By means of the present invention, a multicolor filter can be prepared for optical elements, particularly solid state imagers such as charge coupled devices, by a method which is not susceptible to the deficiencies of the prior art and which provides a stable and effective filtering element. While the art is replete with disclosures relative to providing color filtration to charge coupled devices, many of the method for forming such filters are not practical in that the method employed is excessively complicated with a number of steps employing materials or procedures which could be detrimental to the underlying optical element on which the filter is formed. Long-term stability of the filter element as well as adhesion to the optical substrate are also problems encountered in the art.

The use of negative photoresists introduced the problem of swelling of the photoresist composition which interfered with the attainment of accurate line widths to the extent that spaces separating lines could be bridged by the swelling, while the use of dye in amounts useful for color filter applications in a positive photoresist was contraindicated due to the above-mentioned problems of introducing foreign matter into the photoresist composition.

The novel process of the present invention provides a convenient and rapid method for preparing a multicolor optical filter element which can be prepared under clean-room conditions and which functions as a highly efficient filter for the optical element.

The novel method of the present invention involves preparing a composition comprising a positive photoresist and the desired dye. The thus-formed composition is coated onto the desired substrate, such as the surface of a charge coupled device, by dipping, spraying, spin coating, or other methods conventional in the photoresist art. The coating is dried by removal of the solvent, whereupon good adhesion of the entire coating to the substrate is obtained. Predetermined areas are exposed by irradiation at a wavelength adapted to enhance the solubilization of the photoresist. The coating is then developed; that is, the exposed areas wherein the photoresist has achieved greater degree of solubility is removed by an appropriate solvent, which is also termed a developer in the art. The remaining areas constitute the lines or stripes of mosaic of the first color. The areas of the photoresist which have been exposed and removed by the developer are than coated with a composition comprising a photoresist and a second dye of a different color. Again, predetermined areas of the coating are exposed and developed resulting now in areas of two colors. A baking step, ultraviolet exposure below 300 nm, or a combination of both, is preferably employed after each set of elements are formed to provide stability to the elements and to prevent attack on already formed elements during subsequent coating and development steps. It will be seen that this operation may be repeated to provide as many different color elements in as many different arrangements as may be desired. Generally, filters are prepared possessing various combinations of red, green, blue, cyan, yellow and magenta elements.

The term "positive photoresist" as used herein is intended to refer to a composition which, in its dried-down state, when exposed to appropriate wavelength radiation is rendered more soluble in a developer composition than the unexposed areas, in contrast to a negative photoresist which is inherently soluble in a developer composition and which is cross-linked or hardened by exposure to render it less soluble in the exposed areas. Positive photoresist compositions are generally phenolic-formaldehyde novolak resins employed in conjunction with a sensitizer or photoactive compound which is usually a substituted naphthoquinone diazide compound. The naphthoquinone sensitizer acts as a dissolution rate inhibitor with respect to the novolak resin in aqueous alkaline solution. However, upon exposure to radiation, the sensitizer, which is a hydrophobic material, undergoes a structural transformation which converts its functionality as a dissolution rate inhibitor for the resin to a dissolution rate accelerator for the exposed area of the photoresist. In the present invention, the level of photoactive compound is not critical. The specific amount of photoactive compound is selected with regard to speed or contrast desired. The specific positive photoresist is not critical, and commercially available photoresists may be conveniently employed. Preferably, the photoresist employed has minimal inherent color. A conventional resin/photoactive compond composition would consist of about 80–85% by weight, dry basis, of resin and 15–20% by weight, dry basis, of photoactive compound wherein the two components are mixed or chemically bonded together. Other conventional additives may optionally be employed in the photoresist composition, including plasticizers, adhesion promoters, surfactants and the like.

It has unexpectedly been found that filters can be prepared employing extremely large quantities of the desire dye. Then, while an undyed prior art composition may contain 15–20% by weight, dry basis, of photoactive compound; and a composition designed to control reflected light would only contain a few percent dye, the composition of the present invention contains 40–75% by weight, dry basis, of resin, 10–18% by weight, dry basis, of photoactive compound, and in excess of 10% up to 50%, by weight, dry basis, of dye. It will be seen, therefore, that dye can constitute a major portion of the composition, generally equalling, and in many cases, exceeding the quantity of photoactive compound. In a preferred embodiment, the dye constitutes in excess of 30% by weight of the composition. Surprisingly, even with this quantity of "foreign" matter in the composition, satisfactory filter elements can be prepared without significant detrimental effect on the functionality of the photoactive compound. Thus, in spite of the conversion of the non-polar compound to a polar compound by exposing radiation, the vast amount of "foreign" material does not significantly effect the selectivity of development.

Thus, it has been found that chemically compatible, optically appropriate types of dyes do not adversely effect the control of photoresist solubility by the photoactive compound even though the dye is present in a high concentration relative to the photoactive compound. While the quantity of dye should be expected to be itself a significant solubility inhibitor or enhancer, overwhelming the control of the photoactive compound, dyes have been found that do not significantly alter this balance, and normal concentrations of photoactive compounds can be employed with only slight changes in development times.

The dye employed in the present invention must be soluble in the same solvent as the resin of the photoresist is soluble. Optionally, a second solvent may be employed with the dye to facilitate dissolution of the dye. The dye is also non-ionic in its normal state. The dye must also be thermally stable and light stable, that is, so that during processing or during the heat-stabilization step, the pre-dyed color will be sustained. Since the product is a filter it should have good long term stability. It is also necessary that the dye interact sufficiently with the resin whereby crystallization into a separate phase will not occur upon drying of the coating composition. To achieve this compatibility, the dyes are selected to have the same polarity as that of the resin so that the dye will mimic the bulk properties of the resin. In the case of a novolak resin, the dye preferably contains amino groups, hydroxyl groups, and, more preferably, hydroquinone or quinone groups. The concentration of dye in the coating composition is selected with respect to the desired dye density of the filter elements. Thus, the concentration of the dye must be such to provide predetermined absorption and transmission filtering characteristics for the specified color element. As stated above, the dye constitutes in excess of 10% up to about 50% by weight, dry basis, of the composition. The dye should also have good transmission, i.e., be substantially non-absorptive, in the exposure wavelength of the photoresist, generally the ultraviolet, for efficiency in converting the photoactive compound to a dissolution rate accelerator and to minimize exposure gradient in the photoresist layer. By "substantially non-absorptive" is meant that the dye will permit sufficient exposure at the exposing wavelength of the photoresist to form a usable developed line profile. The absorption of the dye in the visible wavelength is very high relative to the epxosing wavelength of the photoresist. It should also be understood that the term "dye", as used herein, is intended to refer to combinations of one or more dyes as well as single dyes and also includes, as well as dyes in the visible region, near infrared and fluorescent dyes. From the foregoing, it will be seen that cationic dyes and organic salts of dyes should be avoided.

By employing the large amounts of dye, i.e., in excess of 10% by weight, dry basis, filters having good light transmission characteristics are obtained without the need for very thick filter elements. Thus, the filter elements of the present invention can be 2 micrometers or less. The following are representative dyes useful in the present invention and which will be referred to below.

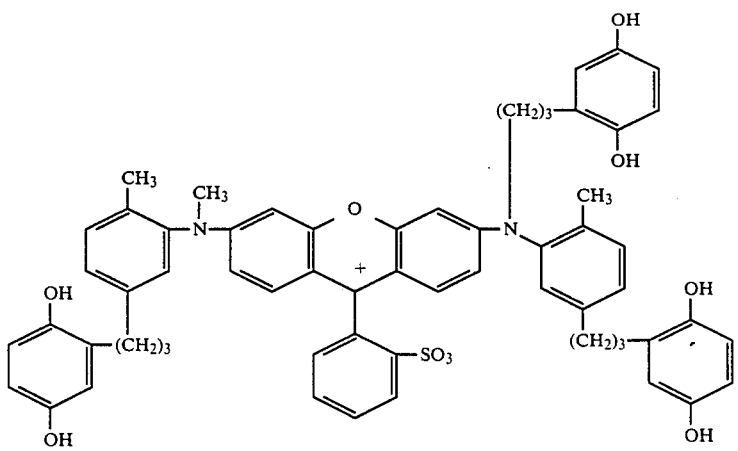

MAGENTA Dye A

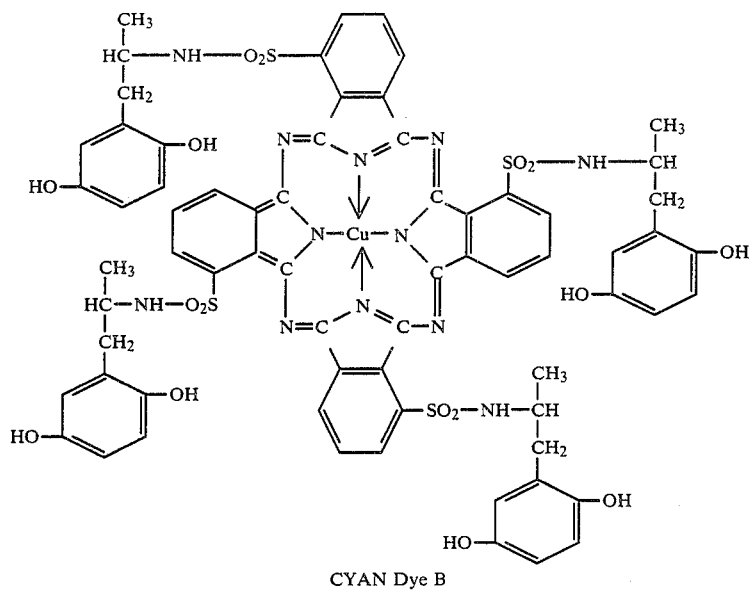

CYAN Dye B

Dye C C.I. 12715 Solvent Red 8
Dye D C.I. Solvent Yellow 88
Dye E C.I. 61551 Solvent Blue 36

Dyes A and B, and those dyes of similar structure, i.e., dyes which contain hydroquinonyl groups possess particularly advantageous stability characteristics. Upon the addition of these dyes to the photoresist composition, an increase in viscosity is noted, indicating hydrogen bonding of the dyes to the resin in the photoresist. As stated above, it is desirable with some dyes to introduce them into the photoresist composition by means of a cosolvent. For example, it is preferable to predissolve Dye A in dimethyl formamide and then add that solution to the photoresist composition.

The terms "developer" and "developing" as used herein are intended to refer to compositions and process steps conventional in the photoresist which, by virtue of the exposure has been rendered significantly more soluble than unexposed areas of the photoresist coating. Generally, the developer is an aqueous alkaline solution, such as sodium hydroxide, or other alkali metal or quaternary ammonium hydroxide solution.

The following non-limiting examples illustrate the novel process of the present invention. The photoresist employed in Examples 1 and 2 was Hunt 256 Positive Photoresist, sold by Philip A. Hunt Chemical Corporation, Palisades Park, N.J. The photoresists used in Examples 3 and 4 are designated therein.

EXAMPLE 1

A 3 inch silicon wafer on which a charge coupled device has been fabricated was spin coated with methanol to remove any dust and then dried for 3 minutes at 190° C. After holding the wafer for one minute to cool it, it was spin coated with hexamethyldisilazane in ethyl cellosolve acetate as an adhesion promoter and then dried on a hot plate for 5 minutes at 95° C. The green line was formed by spin coating 2 ml of the photoresist composition containing 6.7 weight percent Dye B and 3.6 weight pecent Dye D based on the total coating composition, at 7100 r.p.m. for 30 seconds. On a dry weight basis, Dye B was 19.7% and Dye D was 10.6% The coating was dried in an oven for 30 minutes at 95° C. The wafer was aligned and given a 45 second exposure with a 350 watt mercury lamp with a Karl Suss Mask Aligner. Development was carried out by immersion for 120 seconds using developer H-427 sold by Philip A. Hunt Chemical Corporation, Palisades Park, NJ, rinsed 30 seconds in distilled water and baked in an oven for 30 minutes at 180° C. The yellow element was formed by spin coating 2 ml of the photoresist composition containing 3.8 weight percent of Dye D, at 3000 r.p.m. for 30 seconds. On a dry weight basis, Dye D was 13%. The coating was dried for 30 minutes at 95° C., given a 20 second exposure with the Karl Suss Mask Aligner, developed by Immersion for 120 seconds in developer H-427 and then rinsed for 30 seconds in distilled water. The wafer was then baked for 30 minutese at 180° C. The cyan element was formed by spin coating 2 ml of the photoresist composition containing 7 weight percent of Dye B at 4000 r.p.m. for 30 seconds. On a dry weight basis, Dye B was 22.2%. The coating was dried for 30 minutes at 95° C., given a 20 second exposure by the procedure described above with the Karl Suss Mask Aligner and developed by immersion for 60 seconds in H-427 developer, rinsed for 30 seconds in distilled water and dried in filtered nitrogen. The wafer was then exposed to actinic radiation for about 30 seconds to bleach any residual sensitizer.

EXAMPLE 2

A 3 inch silicon wafer on which a charge coupled device has been fabricated was spin coated with methanol to remove any dust and then dried for 3 minutes at 190° C. After holding the wafer for one minute to cool it, it was spin coated with hexamethyldisilazane in ethyl cellosolve acetate as an adhesion promoter and then dried on a hot plate for 5 minutes at 95° C. The green line was formed by spin coating 2 ml of the photoresist composition containing 6.7 weight percent Dye B and 3.6 weight percent Dye D based on the total coating composition at 7100 r.p.m. for 30 seconds. On a dry weight basis Dye B was 19.7% and Dye D was 10.6%. The coating was dried in an oven for 30 minutes at 95° C. The wafer was aligned and given a 45 second exposure with a 350 watt mercury lamp with a Karl Suss Mask Aligner. Development was carried out for 120 seconds by immersion using developer H-427 sold by Philip A. Hunt Chemical Corporation, Palisades Park, N.J., rinsed 30 seconds in distilled water and baked in an oven for 30 minutes at 180° C. The red element was formed by spin coating two ml of the photoresist composition containing 4.3 weight percent of Dye C at 7100 r.p.m. for 30 seconds. On a dry weight basis Dye C was 14.5%. The coating was dried for 30 minutes at 95° C., given a 20 second exposure with the Karl Suss Mask Aligner, developed by immersion for 60 seconds in developer H-427 and then rinsed for 30 seconds in distilled water. The wafer was then baked for 30 minutes at 180° C. The blue element was formed by spin coating 2 ml of the photoresist composition containing 1 weight percent of Dye A and 3.4 weight pecent of Dye E at 2500 r.p.m. for 30 seconds. On a dry weight basis Dye A was 3.4% and Dye E was 11.4%. The coating was dried for 30 minutes at 95° C., given a 20 second exposure by the procedure described above with the Karl Suss Mark Aligner and developed by immersion for 120 seconds in H-427 developer, rinsed for 30 seconds in distilled water and dried in filtered nitrogen. The wafer was then exposed at actinic radiation for about 30 seconds to bleach any residual sensitizer.

EXAMPLE 3

A 4 inch silicon wafer on which a charge coupled device has been fabricated was spin coated at 5000 r.p.m. for 30 seconds with hexamethyldisilazane in ethyl cellosolve acetate as an adhesion promoter and then spun dry at room temperature. The green line was formed by spin coating 4 ml of the Hunt 256 photoresist composition used in Example 1 containing 18.8% weight percent, (dry basis) Dye B and 13.56 weight percent, (dry basis) Dye D based on the total coating composition, at 5000 r.p.m. for 30 seconds. The coating was dried on a hot plate for 2 minutes at 95° C. The wafer was aligned and exposed with a Perkin Elmer Micralign scanner at aperture 1, speed 050. Development was carried out by ultrasonic spray for 50 seconds using developer H-411 sold by Philip A. Hunt Chemical Corporation, rinsed 30 seconds in distilled water and baked in an oven for 25 minutes at 180° C. The red element was formed by spin coating 4 ml of the Hunt 256 photoresist composition containing 14.5 weight percent (dry basis) of Dye C at 5000 r.p.m. for 30 seconds. The coating was dried for 2 minutes on a hot plate at 95° C., aligned and exposed with the Perkin Elmer Micralign Scanner at aperture 1, speed 150, developed by ultrasonic spray for 30 seconds in Hunt developer H-427 and then rinsed for 30 seconds in distilled water. The wafer was then baked in an oven for 25 minutes at 180° C. The blue element was formed by spin coating 2 ml of KTI 820 photoresist composition sold by KTI Chemicals, Inc., Wallingford, Conn., containing 9.9 weight percent (dry basis) of Dye E, 5.66 weight percent (dry basis) of Dye A, and 9.9 weight percent (dry basis) of Dye B at 6000 r.p.m. for 30 seconds. The coating was dried on a hot plate for 2 minutes at 95° C., aligned and exposed by the procedure described above with the Perkin Elmer Micralign Scanner, aperture 1, speed 150 and developed by ultrasonic spray for 40 seconds in KTI 932 developer, diluted 50% with water, rinsed for 30 seconds in distilled water and spun dry. The wafer was then exposed to actinic radiation for about 60 seconds to bleach any residual sensitizer and then dried in an oven at 120° C.

The photoresists and developers employed in the following example were sold by KTI Chemical, Inc., Wallingford, Conn.

EXAMPLE 4

A 4 inch silicon wafer on which a charge coupled device has been fabricated was spin coated at 5000 r.p.m. for 30 seconds with hexamethyldisilazane in ethyl cellosolve acetate as an adhesion promoter and then spun dry at room temperature. The yellow line was formed by spin coating 4 ml of photoresist KTI 820 composition containing 20.1 weight percent (dry basis) Dye D on the total dye coating composition at 3500 r.p.m. for 30 seconds. The coating was dried on a hot plate for 2 minutes at 95° C. The wafer was aligned and exposed with a Perkin Elmer Micralign Scanner at aperture 1, speed 065. Development was carried out by ultrasonic spray for 80 seconds using developer KTI 932 diluted 50% with water, rinsed 60 seconds in distilled water, spun dry and baked in an oven for 20 minutes at 150° C. The cyan element was formed by spin coating two ml of the photoresist composition KTS 820 containing 25.9 weight percent (dry basis) of Dye B at 3300 r.p.m. for 30 seconds. The coating was dried for 4 minutes at 95° C., aligned and exposed with the Perkin Elmer Micralign Scanner at aperture 1, speed 100, developed by ultrasonic spray for 30 seconds with developer KTI 932 diluted 50% with water and then rinsed for 60 seconds and then spun dry. The wafer was then exposed to actinic radiation to bleach any residual sensitizer and then dried by baking on a hot plate at 110° C. for 2 minutes.

Because of the difficulty and inaccuracy in obtaining absolute reflectance data from the filters on the charge coupled devices, for purposes of evaluation the dyed photoresist formulation of the desired thickness was coated on a glass support and dried. The coating was either baked at 180° C., if appropriate for the color under consideration, or given an overall exposure with ultraviolet light to bleach the sensitizer in the case of the final blue or cyan lines. Transmission between 800 and 350 nm was measured on a spectrophotometer and the thickness was measured using a stylus profilometer. These values are used to assign a transmission value to filter elements of known thickness made with the same formulation.

The following table sets forth transmission value for various compositions employed in the method of the present invention. The filter thickness was about 2 microns.

| Filter Color | Dye | Dye Weight % of Photoresist Composition Including Solvent | Dye Weight % of Photoresist Composition, Dry Basis | % Transmission | | |
|---|---|---|---|---|---|---|
| | | | | 450 nm | 535 nm | 650 nm |
| Red | C | 4.3 | 14.5 | 5 | 0.6 | 85 |
| Green | B | 6.7 | 19.7 | 6 | 56 | 4 |
| | D | 3.6 | 10.6 | | | |
| Blue | E | 3.4 | 11.4 | 73 | 20 | 2.4 |
| | A | 1 | 3.4 | | | |
| Cyan | B | 7 | 22.2 | 68 | 68 | 3.5 |
| Yellow | D | 3.8 | 13.0 | 9 | 78 | 92 |
| Green | B | | 18.8 | 7.2 | 70 | 6.7 |
| | D | | 13.6 | | | |
| Blue | E | | 9.9 | 77 | 12 | 1.5 |
| | A | | 5.66 | | | |

| Filter Color | Dye | Dye Weight % of Photoresist Composition Including Solvent | Dye Weight % of Photoresist Composition, Dry Basis | % Transmission 450 nm | % Transmission 535 nm | % Transmission 650 nm |
|---|---|---|---|---|---|---|
| | B | | 9.9 | | | |
| Cyan | B | | 25.9 | 68 | 66 | 2.2 |
| Yellow | D | | 20.1 | 1.8 | 72 | 96 |

Because of the relatively high dye loadings employed in forming the filter elements of the present invention, the exposing radiation is attenuated to some degree such that the profile of the resulting walls of the first element applied to the solid state imagers will be beveled, typically 45°–60°, rather than straight edges if there is no adjacent filter element wall or other features. In order to provide sufficient exposure at the bottom of the photoresist layer, the upper regions of the layer receives a greater proportion of exposing radiation than the bottom regions. Upon development, the above-described beveled walls and trapezoidal profile are obtained. However, this is an advantageous feature of the present invention because, by adjusting mask dimensions so that the edges of a given filter element extend over the channel stop up to the edge of the adjacent element, these beveled edges can physically match with the dyed photoresist composition used to form a subsequent adjacent filter element. The combination of the two dyes will control light distribution over the channel stop. Taking advantage of the trapezoidal filter element profile in this manner can eliminate a separate step to mask the channel stop. The extent of beveling can be adjusted by changing exposure conditions and development parameters.

As examples of suitable solvents employed in the photoresist compositions or as additional solvents for the dyes, mention may be made of the following:
dimethyl sulfoxide
dimethyl formamide
n-butyl acetate
2-ethoxyethyl acetate
ethoxyethyl proprionate
xylenes
ethyl benzene
and combinations thereof.

It will be understood that the filter may be formed in any desired pattern, such as stripe or mosaic form. The particular pattern will be determined by the exposure scheme, e.g., the configuration of the mask.

It will also be understood that the dyed photoresist layers which constitute the filter elements are not removed or removable from the solid state image and constitute an integral component of the solid state imagers.

The present invention can also be employed to form a filter having filter elements formed of positive photoresists and filter elements formed of negative photoresists. Thus, one advantage of such a system is that the filter may not require a thermal stabilization step. Negative photoresist solvents and developers can be selected which will not attack positive photoresists.

I claim:

1. A method for making a color filter having a plurality of colored filter elements, which method comprises the steps of
    (a) forming, onto a support, a solvent-coating of a dye-containing positive photoresist composition and drying said solvent coating to an adherent layer, said composition comprising a photoresist resin and a dye; said dye being soluble in the solvent of said photoresist composition and constituting in excess of 10% up to about 50% of said composition, on a dry weight basis; said dye having substantially the same polarity as said resin, thereby interacting sufficiently with said resin and being sufficiently compatible therewith as not to form a separate phase from said coated photoresist composition; said dye providing the desired dye density and the predetermined absorption and transmission properties characteristic of the predetermined color desired in filter elements to be prepared from said photoresist composition; said dye being sufficiently transmission of radiation used for exposure of said photoresist composition as to permit desired control of the solubility of said photoresist composition in areas of exposure and the formation on development, of a pattern of said filter elements having said predetermined absorption and transmission properties;
    (b) exposing predetermined portions of said layer to radiation adapted to increase the solubility of said layer in the exposed areas;
    (c) developing said exposed areas to form said pattern of filter elements; and
    (d) repeating steps (a) to (c) with a different color dye in said composition.

2. The method of claim 1 wherein said positive photoresist composition comprises a novolak resin and a photoactive dissolution rate inhibitor.

3. The method of claim 2 wherein said novolak is present at a level of about 40–75% by weight, dry basis, said photoactive dissolution rate inhibitor is present at a level of about 10–18% by weight, dry basis, and said dye is present at a level in excess of 10% to 50% by weight, dry basis.

4. The method of claim 3 wherein said dye is present at a level in excess of 30% up to about 50% by weight, dry basis.

5. The method of claim 1 which includes stabilizing said filter elements.

6. The method of claim 5 which includes a thermal stabilization step.

7. The method of claim 5 wherein said stabilization step comprises subjecting said filter elements to ultraviolet radiation.

8. The method of claim 5 which includes both an ultraviolet and a thermal stabilization step.

9. The method of claim 2 wherein said dye contains hydroxyl groups.

10. The method of claim 9 wherein said dye contains hydroquinone groups.

11. The method of claim 1 which includes the step of drying said composition prior to exposure.

12. The method of claim 1 wherein said exposing radiation is predominantly in the ultraviolet region.

13. The method of claim 1 wherein said exposed areas are developed by contact with an aqueous alkaline solution.

14. The method of claim 1 wherein said dye is hydrogen bonded to the resin of said positive photoresist.

15. The method of claim 1 wherein said support is a solid state imager.

16. The method of claim 1 wherein said solid state imager is a charge coupled device.

17. The method of claim 16 wherein said charge coupled device is of the type comprising a plurality of spaced apart elements each defined by a surrounding channel stop, said method further comprising the step of predetermining the portions of said composition to be exposed to radiation by masking selected ones of said elements in a manner so that the edges of the filter elements formed upon the subsequent exposure and development of said selectively masked elements extends over the channel stop surrounding said selectively masked elements.

18. A method for making a color filter having a plurality of colored filter elements, which method comprises the steps of
   (a) forming, onto a support, a solvent coating of a dye-containing positive photoresist composition and drying said solvent coating to an adherent layer, said composition comprising 40-75% by weight, dry basis, of a novolak resin, 10-18% by weight, dry basis, photoactive dissolution rate inhibitor and a first dye in excess of 10% to 50% by weight, dry basis; said first dye being soluble in the solvent of said photoresist composition; said first dye having substantially the same polarity as said novolak resin, thereby interacting sufficiently with said resin and being sufficiently compatible therewith as not to form a separate phase from said coated photoresist composition; said dye providing the dseired dye density and the predetermined absorption and transmission properties characteristic of the predetermined color desired in filter elements to be prepared from said photoresist composition; said dye being sufficiently transmissive of radiation used for exposure of said layer as to permit desired control of the solubility of said photoexposed photoresist composition in exposed areas, and the formation on development, of a pattern of said filter elements having said predetermined absorption and transmission properties;
   (b) exposing predetermined portions of said layer to radiation adapted to increase the solubility of said layer in the exposed areas;
   (c) developing said exposed areas to form said pattern of filter elements;
   (d) forming a second layer on said support with a composition comprising a negative photoresist and a second dye; said second dye being soluble in the solvent of the photoresist;
   (e) exposing predetermined portions of said second layer to radiation adapted to cross-link the photoresist in the exposed areas; and
   (f) developing said second layer to provide a second set of filter elements.

19. A method for making a color filter having a plurality of colored filter elements, which method comprises the steps of
   (a) forming, on a solid state imager, a solvent coating of a dye-containing positive photoresist composition, said composition comprising a novolak resin at a level of about 40-75% by weight, dry basis, a photoactive dissolution rate inhibitor at a level of about 10-18% by weight, dry basis, and a dye of a first color, at a level in excess of 10% to 50% by weight dry basis; said dye being soluble in the solvent to said photoresist composition; said first color dye having substantially the same polarity as said novolak resin, thereby interacting sufficiently with said novolak resin and being sufficiently compatible therewith as not to form a separate phase from said coated photoresist composition; said first color dye providing the desired dye density and the predetermined absorption and transmission properties of filter elements to be prepared from said layer; said dye being sufficiently transmissive of radiation used for exposure of said photoresist composition as to permit the desired control of the solubility of said photoresist composition in areas of exposure, and the formation on development, of a pattern of filter elements of said first color;
   (b) drying said solvent coating to an adherent layer;
   (c) exposing predetermined portions of said layer to radiation adapted to increase the solubility of said layer in the exposed areas;
   (d) developing said exposed areas to form said pattern of filter elements;
   (e) thermally stabilizing said pattern of filter elements;
   (f) forming a solvent coating of a second dye-containing positive photoresist composition, said second composition being defined as in step a), except comprising a dye of a second color, said second color dye being soluble in the solvent of said second photoresist composition; said second color dye interacting sufficiently with the novolak resin of said second composition and being sufficiently compatible therewith as not to form a separate phase from said coated photoresist composition; said second color dye providing the desired dye density and the predetermined absorption and transmission properties of filter elements to be prepared from said photoresist composition; said dye being sufficiently transmissive of radiation used for exposure of said photoresist composition as to permit desired control of the solubility of said photoresist composition in areas of exposure, and the formation on development, of a pattern of filter elements of said second color;
   (g) drying the solvent coating of said second composition to an adherent layer;
   (h) exposing predetermined portions of said layer of said second composition to radiation adapted to increase the solubility of said layer in the exposed areas;
   (i) developing said exposed areas to form a second pattern of filter elements;
   (j) thermally stabilizing said second pattern of filter elements;
   (k) forming a solvent coating of a third dye-containing positive photoresist composition, said third composition being defined as in step (a), except comprising a dye of a third color, said third color dye being soluble in the solvent of said third photoresist composition; said third color dye interacting sufficiently with the novolak resin of said third composition and being sufficiently compatible therewith as not to form a separate phase from said coated photoresist composition; said third color dye providing the desired dye density and the predetermined absorption and transmission properties of filter elements to be prepared from said photoresist composition; said dye being sufficiently transmissive of radiation used for exposure of said photoresist composition as to permit desired control of the solubility of said photoresist composition in areas of exposure, and the formation on development, of a pattern of filter elements of said third color;

(l) drying the solvent coating of said third composition to an adherent layer;

(m) exposing predetermined portions of said layer of said third composition to radiation adapted to increase the solubility of said layer in the exposed areas; and (n) developing said exposed areas to form a third pattern of filter elements.

20. The method of claim 19 wherein said first, second and third dyes are red, green and blue respectively.

21. The method of claim 19 wherein said first, second and third dyes are yellow, cyan and magenta respectively.

* * * * *